(12) United States Patent
Minoda

(10) Patent No.: US 8,672,661 B2
(45) Date of Patent: Mar. 18, 2014

(54) IMPRINT APPARATUS AND ARTICLE MANUFACTURING METHOD

(75) Inventor: Ken Minoda, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 135 days.

(21) Appl. No.: 13/367,447

(22) Filed: Feb. 7, 2012

(65) Prior Publication Data

US 2012/0200006 A1    Aug. 9, 2012

(30) Foreign Application Priority Data

Feb. 7, 2011 (JP) ................... 2011-023984

(51) Int. Cl.
*B29C 71/02* (2006.01)
*B29C 71/04* (2006.01)
*B29C 59/02* (2006.01)

(52) U.S. Cl.
USPC ............. 425/174.4; 425/385; 425/436 R; 425/394; 425/403.1; 425/404; 264/494; 264/496; 264/405; 264/492; 264/334; 264/293; 264/294; 264/299; 264/313

(58) Field of Classification Search
USPC .......... 425/174.4, 385, 436 R, 169, 394, 397, 425/403.1, 404; 264/293, 294, 299, 313, 264/405, 492, 494, 496, 334, 491
See application file for complete search history.

(56) References Cited

U.S. PATENT DOCUMENTS

| | | | |
|---|---|---|---|
| 7,906,060 | B2 | 3/2011 | Willson et al. |
| 2008/0230959 | A1 | 9/2008 | Willson et al. |

FOREIGN PATENT DOCUMENTS

JP        7-117201 A    5/1995

*Primary Examiner* — Joseph S Del Sole
*Assistant Examiner* — Lawrence D Hohenbrink, Jr.
(74) *Attorney, Agent, or Firm* — Rossi, Kimms & McDowell LLP

(57) ABSTRACT

An imprint apparatus that includes a holding unit, and performs an imprint process, including molding of an imprint material on a substrate held by the holding unit using a mold, curing of the molded imprint material, and releasing of the cured imprint material from the mold, to form a pattern on the substrate. The apparatus includes a first cure device configured to perform a first cure process for the imprint material molded by the mold prior to the releasing; and a second cure device configured to perform a second cure process for the imprint material on the substrate conveyed out from the holding unit after the releasing.

10 Claims, 5 Drawing Sheets

IMPRINT APPARATUS AND ARTICLE MANUFACTURING METHOD

BACKGROUND OF THE INVENTION

1. Field of the Invention

The present invention relates to an imprint apparatus and an article manufacturing method.

2. Description of the Related Art

As the demand for microfabrication of semiconductor devices increases, not only a conventional photolithography technology but also a microfabrication technology in which an uncured resin on a substrate is molded using a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint resin, photocurable resin) to a shot area (imprint area) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

In general, the imprint apparatus performs a mold-releasing operation after a resin has been completely cured in one shot, and then, goes to imprint processing for another shot. In contrast, in order to make the time required for a series of imprint processing steps short, there is a method that performs mold-releasing operation in a semi-cured state without waiting for complete curing of a resin in one shot and goes to imprint processing for another shot. Japanese Patent Laid-Open No. 7-117201 discloses a polyester decorative board manufacturing method in which mold-pressing for bringing a shaping film (mold) into contact with an uncured resin on a substrate in an area is performed, and then, a mold-releasing operation is performed before the resin is completely cured. Note that the manufacturing method employs a thermal cycle method for curing a resin by irradiating the resin with infrared radiation. Also, U.S. Patent Application Serial No. 2008/0230959 discloses an imprint method in which a resin polymerization is started by light irradiation, and then, a mold-releasing operation is performed before the resin polymerization has been completed.

Here, in the methods for performing a mold-releasing operation in a semi-cured state as disclosed in Japanese Patent Laid-Open No. 7-117201 and U.S. Patent Application Serial No. 2008/0230959, a resin needs to be completely cured by irradiating the resin with light again after the mold-releasing operation. However, Japanese Patent Laid-Open No. 7-117201 and U.S. Patent Application Serial No. 2008/0230959 do not discuss the fact on how light irradiation is performed after the mold-releasing operation.

SUMMARY OF THE INVENTION

The present invention provides, for example, an imprint apparatus that is advantageous in terms of throughput thereof.

According to an aspect of the present invention, an imprint apparatus that includes a holding unit, and performs an imprint process including molding of an imprint material on a substrate held by the holding unit using a mold, curing of the molded imprint material, and releasing of the cured imprint material from the mold, to form a pattern on the substrate, wherein includes a first cure device configured to perform a first cure process for the imprint material molded by the mold prior to the releasing; and a second cure device configured to perform a second cure process for the imprint material on the substrate conveyed out from the holding unit after the releasing is provided.

According to the present invention, for example, an imprint apparatus that is advantageous in terms of throughput thereof may be provided.

Further features of the present invention will become apparent from the following description of exemplary embodiments with reference to the attached drawings.

DESCRIPTION OF THE EMBODIMENTS

First Embodiment

Figure 1:
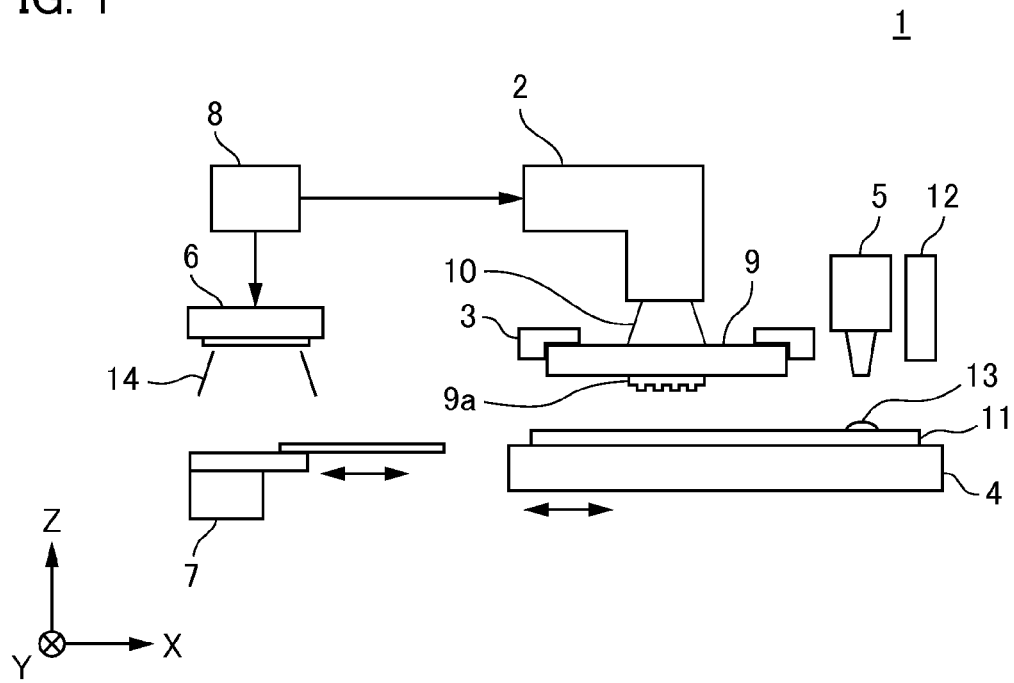
FIG. 1 is a diagram illustrating the configuration of an imprint apparatus according to a first embodiment of the present invention.

Firstly, a description will be given of the configuration of an imprint apparatus according to one embodiment of the present invention. FIG. 1 is a diagram illustrating the configuration of an imprint apparatus of the present embodiment. The imprint apparatus is an apparatus that molds an imprint material (typically, uncured resin) on a wafer (on a substrate), i.e., an object to be treated, using a mold to thereby form a pattern (typically, resin pattern) on the substrate, which is used in the manufacture of devices such as semiconductor devices and the like. Here, the imprint apparatus of the present embodiment is an apparatus employing a photo-curing method. In the following drawings, a description will be given where the Z axis is aligned parallel to the optical axis of each of illumination units that illuminate ultraviolet light onto a resin on a substrate, and mutually orthogonal axes X and Y are aligned in a plane perpendicular to the Z axis. An imprint apparatus 1 includes a first light irradiation unit 2, a mold holding unit 3, a wafer stage 4, a dispenser 5, a second light irradiation unit 6, a substrate conveyer 7, and a controller 8.

The first light irradiation unit 2 is a light irradiation device (first cure device) that irradiates the mold 9 with ultraviolet light 10 as first cure processing for curing a resin after mold-pressing processing for bringing a mold 9 in contact with the resin on a wafer 11. The first light irradiation unit 2 is constituted by a light source (not shown), and a plurality of optical elements that uniformly irradiates a concave and convex pattern 9a (to be described below), i.e., the surface to be irradiated, with the ultraviolet light 10 in a predetermined shape emitted from the light source. In particular, it is preferable that the irradiation area (irradiation range) of light emitted by the first light irradiation unit 2 be approximately equal to the area of the concave and convex pattern 9a or be slightly larger than the area of the concave and convex pattern 9a. The purpose for this is to suppress the occurrence of positional displacement and distortion in the pattern to be transferred onto a resin due to expansion of the mold 9 or the wafer 11, which is caused by heat incident to irradiation of light, by providing the minimum necessary irradiation area. In addition, the purpose for this is also to prevent the occurrence of a fault condition in the subsequent operation of a dispenser due to the fact that the ultraviolet light 10 reflected from the wafer 11 or the like reaches the dispenser 5 to be described below to thereby cure a resin remaining in the discharge section of the dispenser 5. Here, as a light source, a high-pressure mercury lamp, various excimer lamps, an excimer laser, a light emitting diode, or the like may be employed. The light source is appropriately selected depending on the characteristics of a resin serving as a light-receiving body, but the present invention is not limited to the type, number, wavelength, or the like of the light source. Also, the mold 9 is a mold in which a predetermined pattern (e.g., the concave and convex pattern 9a corresponding to a circuit pattern) is three-dimensionally formed on a surface facing a wafer 11. The material of the mold 9 is a material such as quartz or the like through which ultraviolet light can pass.

The mold holding unit (holding unit) 3 draws and holds the mold 9 using a vacuum attraction force or an electrostatic force. The mold holding device 3 includes a mold chuck (not shown), and a mold drive mechanism that drives the mold chuck in the Z axial direction so as to press the mold 9 against an ultraviolet curable resin applied to the wafer 11. The mold-printing operation and the mold-releasing operation performed by the imprint apparatus 1 may be realized by moving the mold 9 in the Z direction as described above, may be realized by moving the wafer stage 4 (the wafer 11) in the Z direction, or may also be realized by moving both the mold 9 and the wafer stage 4 (the wafer 11) in the Z direction.

The wafer stage 4 is a holding unit that holds the wafer 11 by vacuum attraction and is moveable in the XY plane. Here, the wafer 11 is an object to be treated consisting of, for example, a single crystal silicon, and an ultraviolet curable resin (hereinafter referred to simply as "resin"), which is molded by the mold 9, is applied to the treatment surface thereof. The imprint apparatus 1 further includes measuring instrument 12 that performs various measurements for the positioning of the wafer stage 4. The controller 8 to be described below controls the positioning of the wafer stage 4 based on information measured by the measuring instrument 12.

The dispenser 5 applies a resin (uncured resin) 13 to the wafer 11. Here, the resin 13 is a photocurable resin having the property of being cured by receiving irradiation of ultraviolet light, and is appropriately selected depending on the type of semiconductor devices or the like. Instead of providing the dispenser 5 in the interior of the imprint apparatus 1 as shown in FIG. 1, a separate dispenser may be provided at the exterior of the imprint apparatus 1 such that the wafer 11 on which a resin has previously applied by the dispenser is introduced into the interior of the imprint apparatus 1. In accordance with this arrangement, an application step to be performed within the imprint apparatus 1 is eliminated, and thus, the speedup of processing performed by the imprint apparatus 1 may be attained. Also, the dispenser 5 becomes unnecessary, and thus, the manufacturing cost for the entire imprint apparatus 1 may be suppressed.

The second light irradiation unit 6 is a light irradiation device (second cure device) that irradiates the wafer 11 with ultraviolet light 14 again as second cure processing for curing the resin 13 when the mold 9 is not in contact with the resin 13, that is, after mold-releasing processing for releasing the mold 9 from the resin 13 is performed. As a light source provided in the second light irradiation unit 6, a high-pressure mercury lamp may be employed as in the light source provided in the first light irradiation unit 2. A detailed description will be given below of the second light irradiation unit 6.

The substrate conveyer 7 is a conveyer unit that conveys the wafer 11 from a substrate accommodating unit or the like, which is provided in the exterior of the imprint apparatus 1 or in the interior of the imprint apparatus 1, to the wafer stage 4. While, in the imprint apparatus 1 of the present embodiment, only one substrate conveyer 7 is provided, two substrate conveyers that perform supply (convey-in) and collection (convey-out) of the wafer 11 may also be provided in order to achieve improvement in productivity.

The controller 8 may control the operation, adjustment, and the like of the components of the imprint apparatus 1. The controller 8 is constituted by a computer or the like and is connected to the components of the imprint apparatus 1 through a line so as to execute control of the components by a program or the like. In the present embodiment, the controller 8 controls the operation of the mold holding unit 3, the wafer stage 4, and the like as well as the ultraviolet light irradiation by at least the first light irradiation unit 2 and the second light irradiation unit 6. The controller 8 may be integrated with the rest of the imprint apparatus 1, or may be installed at a location separate from the location where the rest of the imprint apparatus 1 is installed.

Next, imprint processing performed by the imprint apparatus 1 will now be described. First, the controller 8 conveys the wafer 11 to the wafer stage 4 using the substrate conveyer 7, and places and fixes the wafer 11 on the wafer stage 4. Then, the controller 8 causes the measuring instrument 12 to perform the alignment measurement for the wafer 11. Next, the controller 8 moves the wafer stage 4 to the application position of the dispenser 5. Then, as an application step, the dispenser 5 applies a resin (uncured resin) 13 to a predetermined shot (imprint area) on the wafer 11. Next, the controller 8 moves the wafer stage 4 such that the shot on the wafer 11 is placed in a position directly below the mold 9. Next, after the mold 9 is aligned with the shot on the wafer 11 and the magnification correction for the mold 9 is carried out using a magnification correction mechanism (not shown), the controller 8 drives the mold drive mechanism so as to press the mold 9 against the resin 13 on the wafer 11 (mold-pressing step). During the mold-pressing step, the resin 13 is filled in the concave portion of the concave and convex pattern 9a formed in the mold 9. Under this condition, the first light irradiation unit 2 emits the ultraviolet light 10 from the back surface (top surface) of the mold 9, and the resin 13 is cured by the ultraviolet light 10 that has been transmitted through the mold 9 as first cure processing (first curing step). It should be noted that, in the first cure processing, the irradiation of the ultraviolet light 10 is not performed until the resin 13 is completely cured, but the controller 8 drives a mold drive mechanism again while the resin 13 is in a semi-cured state to thereby release the mold 9 from the wafer 11 (mold-releasing step).

Figure 2:
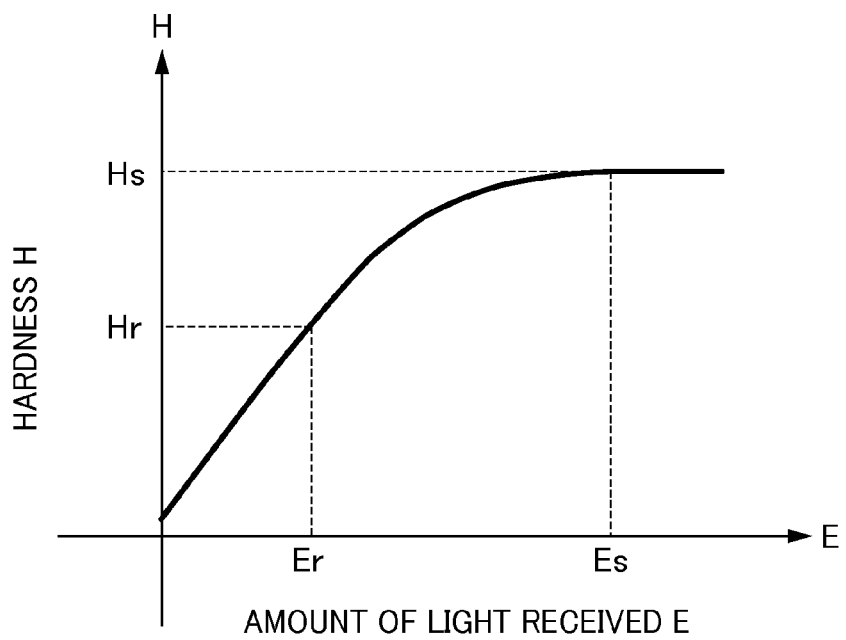
FIG. 2 is a graph illustrating the change in the hardness of a photocurable resin with respect to the amount of light received thereby.

FIG. 2 is a graph illustrating the relationship of the hardness H of a photocurable resin to the amount of light received E by light irradiation. As shown in FIG. 2, the hardness H increases with increasing the amount of light received E, but hardly changes from the hardness Hs when the amount of light received E is equal to or greater than Es. Hereinafter, the state of the hardness that hardly changes from the hardness Hs is referred to as a "completely-cured state". On the other hand, if the hardness H is lower than the minimal hardness Hr (<Hs) by which the shape of the pattern formed in a resin is maintained even when a mold is released from the resin, the resin flows after the mold-releasing operation, and the shape of the pattern is broken. In other words, if the hardness H is in the range of Hr≤H<Hs, the shape of the resin pattern is maintained even when the mold-releasing operation is performed. The state of the hardness H falling within the range of Hr≤H<Hs is hereinafter referred to as a "semi-cured state". In this case, given that the amount of light received required for the hardness H to reach Hr is Er (<Es), the range of the amount of light received E for allowing a resin to be in a semi-cured state falls within Er≤E<Es. In this way, in order to maintain the shape of the pattern formed in a resin subject to the mold-releasing operation, the resin may not necessarily be in a completely-cured state but may be in a semi-cured state. Thus, the irradiation time of light may be shortened by releasing a resin in a semi-cured state from a mold rather than by releasing a resin in a completely-cured state from a mold.

However, if the process proceeds to the subsequent semiconductor device manufacturing step such as an etching step while maintaining the resin 13 in a semi-cured state, the etching resistance of the resin may undesirably affected. Hence, in the imprint apparatus 1, the second light irradiation unit 6 performs the additional irradiation (second curing step) of the ultraviolet light 14 to the resin 13 subject to the mold-releasing operation such that the total amount of light received $E_{total}$ is equal to or greater than Es as second cure processing, the resin 13 is finally in a completely-cured state. In this case, first, after a pattern forming step of forming a resin pattern in a semi-cured state on all of the shots on the wafer 11 has been completed, the controller 8 causes the substrate conveyer 7 to collect the processed wafer 11 and to supply the wafer 11 to be next processed to the wafer stage 4. Next, the controller 8 causes the substrate conveyer 7 to convey the collected wafer 11 to the irradiation area of the second light irradiation unit 6, and causes the second light irradiation unit 6 to perform light irradiation to the wafer 11 positioned under the irradiation area to thereby make the resin 13 be in a completely-cured state. In this manner, the layer of the resin 13 in a completely-cured state following the concave and convex pattern 9a is formed on the surfaces of the shots on the wafer 11. On the other hand, the wafer 11 to be next processed has already been supplied on the wafer stage 4 by the substrate conveyer 7. Thus, the imprint apparatus 1 can perform a pattern forming step of forming a resin pattern on the wafer 11 on the wafer stage 4 while the resin 13 on the wafer 11 is subject to additional irradiation by the second light irradiation unit 6. In other words, as a single apparatus, the imprint apparatus 1 can perform a series of pattern forming steps including mold-pressing processing, first cure processing (semi-curing step), and mold-releasing processing concurrently with second cure processing (completely-curing step) for making the resin 13 in a semi-cured state be in a completely-cured state.

Here, as in the irradiation area of the first light irradiation unit 2, the irradiation area of the second light irradiation unit 6 may be approximately equal to the area of the concave and convex pattern 9a. It is preferable that the irradiation area of the second light irradiation unit 6 be a wider area, for example, an area of which the entire wafer 11 can be irradiated with light at one time. Also, the intensity of the light emitted by the second light irradiation unit 6 may be approximately equal to the intensity of the light emitted by the first light irradiation unit 2. It is preferable that the intensity of the light emitted by the second light irradiation unit 6 be stronger than the intensity of the light emitted by the first light irradiation unit 2. The reason for this is to avoid the reduction in productivity due to the fact that the additional irradiation of the second light irradiation unit 6 is performed at a narrow irradiation area or under low light intensity. The irradiation area of the second light irradiation unit 6 may have a slit shape having a length approximately equal to or greater than the diameter of the wafer 11. The aforementioned second light irradiation unit 6 is arranged on a conveyance path through which the substrate conveyer 7 collects the wafer 11 as described above, whereby the second light irradiation unit 6 may efficiently perform the additional irradiation for the entire surface of the wafer 11 concurrently with the collection of the wafer 11. Furthermore, since it suffices that the second light irradiation unit 6 can emit light such that the resin 13 is in a completely-cured state, that is, the amount of light received E by the resin 13 is equal to or greater than Es, highly accurate control of the amount of irradiation is not needed. Thus, instead of employing an expensive component such as an optical element or the like, the second light irradiation unit 6 may be simpler than the first light irradiation unit 2, and thus, the manufacturing cost for the entire imprint apparatus 1 may be suppressed.

As described above, according to the present embodiment, cure processing for curing an imprint material in a semi-cured state is performed after a substrate has been conveyed-out from a substrate holding unit (wafer stage) (preferably, concurrently with another processing), resulting in improvements in productivity.

Second Embodiment

Figure 3:
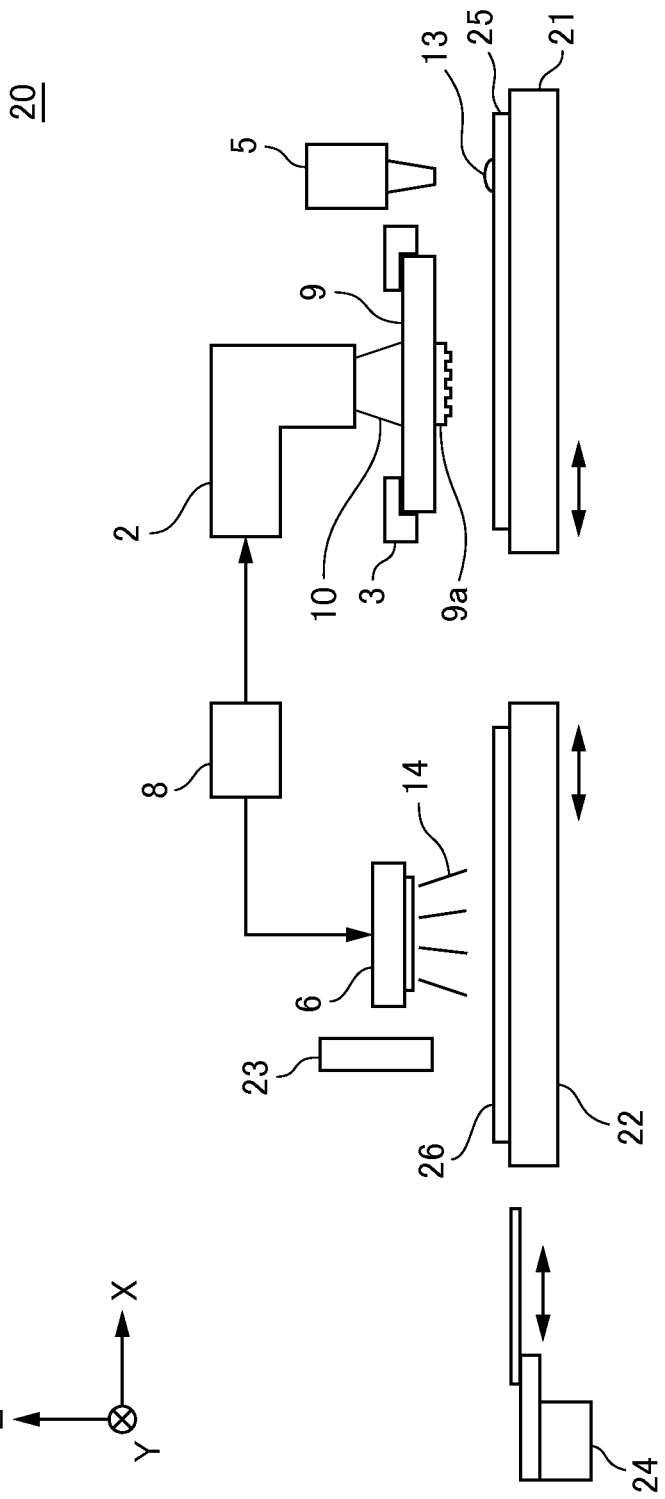
FIG. 3 is a diagram illustrating the configuration of an imprint apparatus according to a second embodiment of the present invention.

Next, a description will be given of an imprint apparatus according to a second embodiment of the present invention. FIG. 3 is a diagram illustrating the configuration of an imprint apparatus 20 of the present embodiment. In FIG. 3, the same components as those shown in FIG. 1 are designated by the same reference numerals and explanation thereof will be omitted. A feature of the imprint apparatus 20 of the present embodiment lies in the fact that the imprint apparatus 20 includes a first wafer stage (first substrate holding unit) 21 corresponding to the wafer stage 4 of the first embodiment and another second wafer stage (second substrate holding unit) 22 so as to process a wafer in a concurrent manner. The first wafer stage 21 and the second wafer stage 22 are alternately movable under the mold holding unit 3 and under the second light irradiation unit 6. Also, the imprint apparatus 20 includes measuring instrument 23 that is provided adjacent the second light irradiation unit 6 and performs the alignment measurement for a wafer. Furthermore, instead of the substrate conveyer 7 of the first embodiment, a substrate conveyer 24 is provided adjacent the second light irradiation unit 6 so as to enable a wafer to be conveyed to the first wafer stage 21 or the second wafer stage 22.

Here, the controller 8 causes the measuring instrument 23 to perform the alignment measurement for a second wafer 26 on the second wafer stage 22 near the second light irradiation unit 6 during a pattern forming step for forming a pattern on a first wafer 25 on the first wafer stage 21. Next, as in the first embodiment, the controller 8 performs the mold-releasing operation in a semi-cured state, and then, moves the first wafer stage 21 to the irradiation position of the second light irradiation unit 6. Concurrently, the controller 8 moves the second wafer stage 22 for which the alignment measurement has been completed to the mold-pressing position at which a resin is molded by the mold 9. Thus, the controller 8 starts a pattern forming step of forming a pattern on the second wafer 26. On the other hand, the controller 8 causes the second light irradiation unit 6 to perform second cure processing for completely curing a resin 27 on the first wafer 25. After completion of second cure processing, the controller 8 causes the substrate conveyer 24 to collect the first wafer 25, and then, causes the substrate conveyer 24 to supply a wafer subject to next imprint processing on the first wafer stage 21. The controller 8 repeats the aforementioned processes for a plurality of wafers.

In this way, according to the present embodiment, a pattern forming step of forming a pattern on one wafer, second cure processing for another wafer, conveyance, alignment measurement, and the like may be performed in a concurrent manner, resulting in further improvement in productivity. In this case, alignment measurement for another wafer may be performed while forming a pattern on one wafer. Thus, for example, as compared with an imprint apparatus having only one wafer stage, a long alignment measurement time may be ensured, resulting in improvement in alignment measurement accuracy as well as improvement in the yield of the devices to be manufactured.

Third Embodiment

Figure 4:
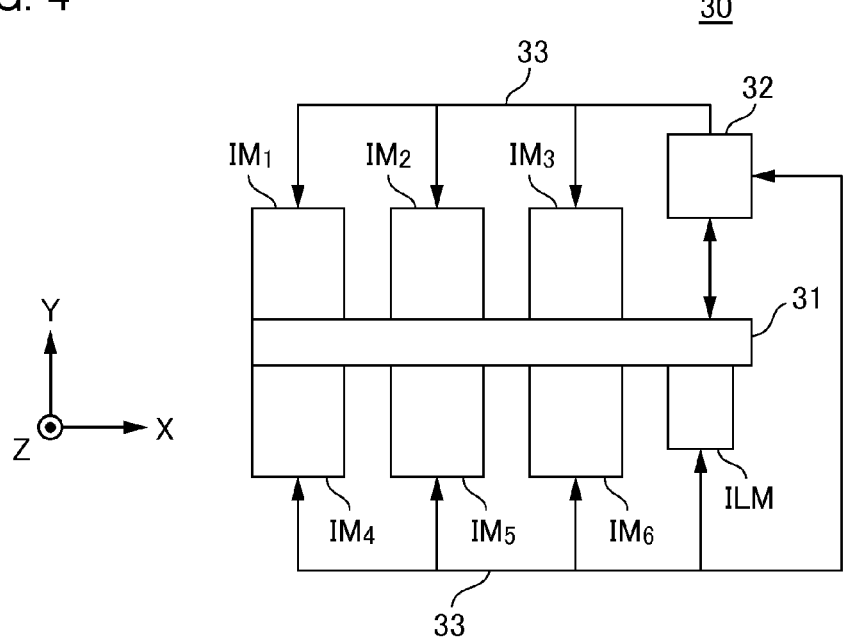
FIG. 4 is a diagram illustrating the configuration of an imprint apparatus according to a third embodiment of the present invention.

Next, a description will be given of an imprint apparatus according to a third embodiment of the present invention. FIG. 4 is a plan view illustrating the configuration of an imprint apparatus 30 of the present embodiment. A feature of the imprint apparatus 30 of the present embodiment lies in the fact that the entire imprint apparatus 30 has a cluster configuration and includes a plurality of imprint modules IM and a light irradiation module ILM for additional light irradiation corresponding to the second light irradiation unit 6 of the embodiment. The term "cluster configuration" in the present embodiment refers to the configuration in which a plurality of the same imprint modules IM is assembled in the same fixing base (or floor). An advantage of the cluster configuration lies in the fact that a foot print may be reduced by sharing a conveyance path for conveying a wafer among a plurality of imprint modules IM. Another advantage of the cluster configuration lies in the fact that a plurality of imprint modules IM may be managed as a single imprint apparatus having high productivity by controlling them in an integrated manner. In general, since an imprint apparatus performs processing such as a mold-pressing operation, a mold-releasing operation, or the like, the productivity of the imprint apparatus is approximately one fourth or less as compared with a lithography apparatus such as an exposure apparatus or the like. In this way, if the difference between the productivity of an imprint apparatus and that of other lithography apparatus for each unit is large, management for the combinatorial use of imprint apparatus and lithography apparatus in, for example, a device manufacturing step may be difficult. Accordingly, if an imprint apparatus has a cluster configuration so as to provide productivity equivalent to that of a single lithography apparatus, management for the combinatorial use of imprint apparatus and lithography apparatus may readily be made.

The imprint apparatus 30 includes six imprint modules (imprint stations) $IM_1$ to $IM_6$, a light irradiation module ILM, a substrate conveyance system 31 provided next to the modules $IM_1$ to $IM_6$ and the ILM, and a controller 32. Each of the imprint modules $IM_1$ to $IM_6$ is basically the same configuration as the imprint apparatus 1 of the first embodiment except that each thereof does not have the second light irradiation unit 6. While, in the present embodiment, the number of imprint modules IM installed is six by way of an example, the present invention is not limited thereto.

Figure 5:
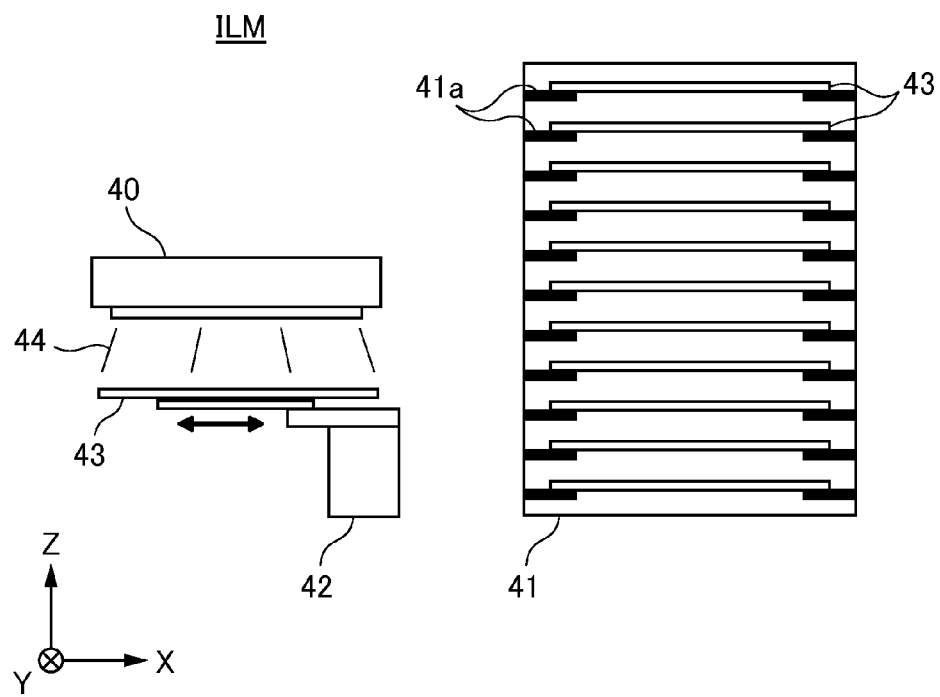
FIG. 5 is a diagram illustrating the configuration of a light irradiation module according to the third embodiment.

FIG. 5 is a diagram illustrating the configuration of a light irradiation module ILM. The light irradiation module ILM serving as an independent module is a cure station having a light irradiation device 40, a substrate storage 41, and a substrate conveyer 42. First, the light irradiation device 40 has the same configuration as that of the second light irradiation unit 6 of the first embodiment, and is an illumination unit that irradiates the wafer 43 with ultraviolet light 44 for completely curing a resin in a semi-cured state on a wafer 43. The substrate storage 41 is a storage unit having a wafer holding unit 41a that can store a plurality of wafers 43 conveyed by the substrate conveyance system 31. The configuration or the shape of the substrate storage 41 is not particularly limited. For example, a substrate-conveying case complying with the SEMI standard such as FOUP or the configuration in which the FOUP itself may be conveyed in the light irradiation module ILM using the substrate conveyance system 31 may also be employed. Also, the substrate conveyer 42 is a conveyer that performs transferring/receiving of the wafer 43 between the light irradiation device 40 and the substrate storage 41. Two substrate conveyers that perform supply (convey-in) and collection (convey-out) of the wafer 43 may also be provided in order to achieve improvement in productivity. While, in the present embodiment, only one light irradiation module ILM is provided in the imprint apparatus 30, a plurality of light irradiation modules ILM may also be provided in the imprint apparatus 30.

The substrate conveyance system 31 has a conveyance robot (not shown) that conveys the wafer 43 prior to processing into predetermined wafer feeding openings of the imprint modules $IM_1$ to $IM_6$ and the light irradiation module ILM and conveys the processed wafer 43 out therefrom. The substrate conveyance system 31 also conveys the wafer 43 into/out of other facilities (processing devices) in a device manufacturing factory at which the imprint apparatus 30 is installed. Furthermore, the controller 32 is connected with the imprint modules $IM_1$ to $IM_6$, the light irradiation module ILM, and the substrate conveyance system 31 via a line 33, and may control all of them in an integrated manner. Note that the controller 32 may be used in conjunction with a controller included in any one of imprint modules IM, or may be installed at a location separate from the location where the rest of the imprint apparatus 30 is installed.

Next, a description will be given of imprint processing performed by the imprint apparatus 30. First, the controller 32 causes the substrate conveyance system 31 to convey the wafer 43 into the imprint modules $IM_1$ to $IM_6$ as appropriate from other facilities in a device manufacturing factory. Here, each of the imprint modules $IM_1$ to $IM_6$ performs mold-pressing processing, first cure processing, and mold-releasing processing of the first embodiment with respect to the wafer 43. Next, the controller 32 causes the substrate conveyance system 31 to collect the wafer 43 on which the pattern of a resin in a semi-cured state is formed from the imprint modules $IM_1$ to $IM_6$, and to convey the wafer 43 into the light irradiation module ILM. Next, in the light irradiation module ILM, the substrate conveyer 42 first receives the wafer 43 from the substrate conveyance system 31, and temporarily stores the wafer 43 in the substrate storage 41. Next, the substrate conveyer 42 conveys out the wafer 43 from the substrate storage 41 as appropriate, and moves the wafer 43 to the irradiation area of the light irradiation device 40. At this time, as in second cure processing of the first embodiment, the light irradiation device 40 irradiates the wafer 43 with the ultraviolet light 44 to thereby make a resin on the wafer 43 be in a completely-cured state. Next, the substrate conveyer 42 stores the wafer 43 on which the resin is in a completely-cured state in the substrate storage 41 again. The light irradiation module ILM repeats such processing in accordance with the number of the wafers 43 stored in the substrate storage 41. Then, the controller 32 causes the substrate conveyance system 31 to convey out the wafer 43 for which the process has been completed by the light irradiation module ILM from the substrate storage 41 to other facilities in a device manufacturing factory. In this way, according to the present embodiment, a pattern forming step of forming a pattern on a wafer by a plurality of imprint modules IM, second cure processing by the light irradiation module ILM, conveyance of a wafer by the substrate conveyance system 31, and the like may be performed in a concurrent manner. Thus, the present embodiment is advantageous in improvement in productivity.

Figure 6:
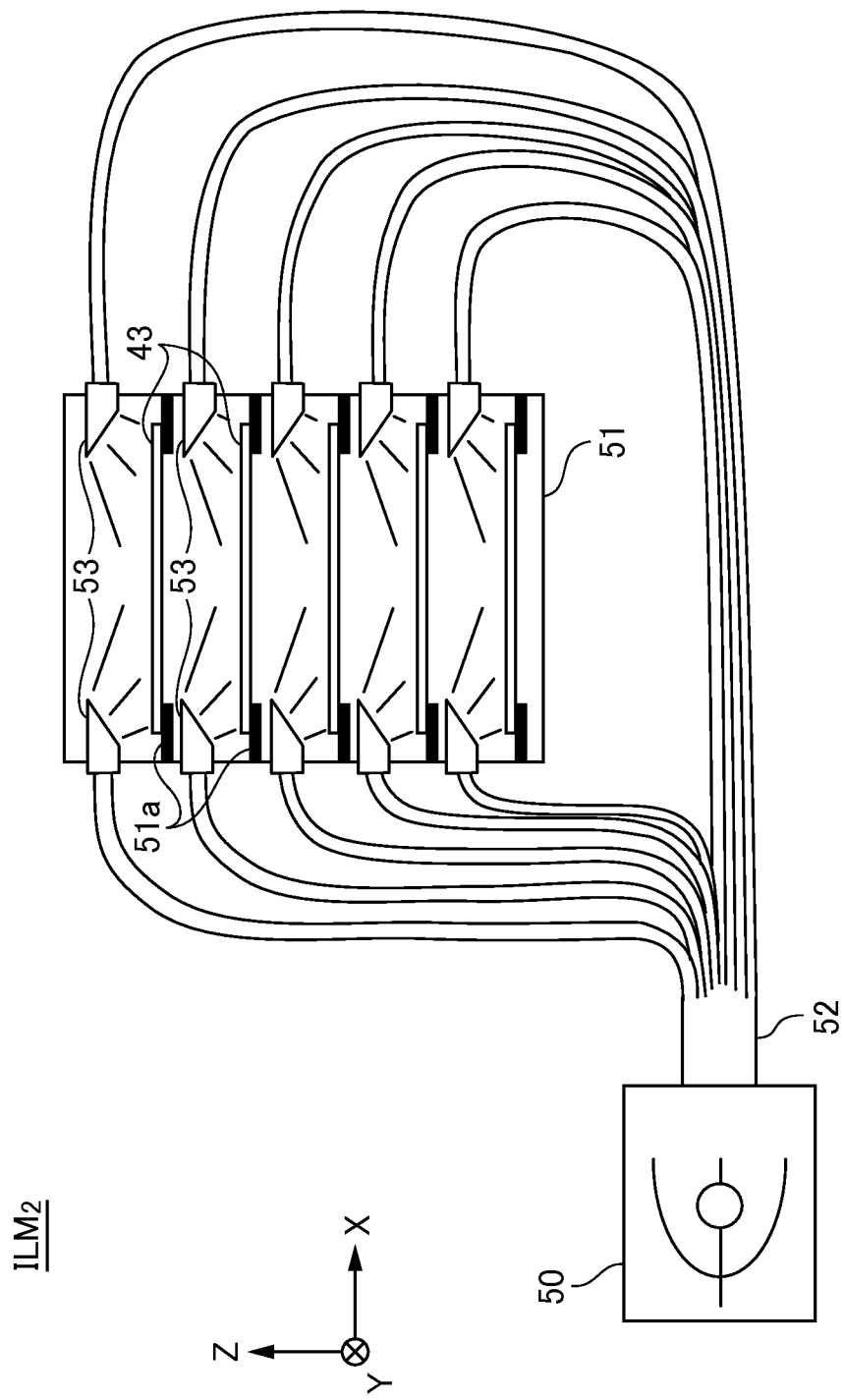
FIG. 6 is a diagram illustrating another configuration of a light irradiation module according to the third embodiment.

The configuration of the light irradiation module ILM is not limited to the above embodiments, but may also be changed as follows. FIG. 6 is a diagram illustrating the configuration of the light irradiation module $ILM_2$ as a first example by changing the configuration of the light irradiation module ILM shown in FIG. 5. A feature of the light irradiation module $ILM_2$ lies in the fact that the light irradiation module $ILM_2$ includes a light source 50 that emits ultraviolet light and a substrate storage 51 that can store a plurality of wafers 43 as in the substrate storage 41 described above, and directs ultraviolet light emitted from the light source 50 to the interior of the substrate storage 51 via an optical fiber 52. For the light source 50, a high-pressure mercury lamp or the like may be employed as in the light source provided in the light irradiation device 40 described above. Ultraviolet light emitted from the light source 50 is directed to each of a plurality of wafer holding units 51a provided in the substrate storage 51 via the optical fiber 52, and is irradiated onto the wafer 43 using an exit optical system (emitting portion) 53. As compared with the light irradiation module ILM shown in FIG. 5, the light irradiation module $ILM_2$ may reduce time required for completely curing a resin in a semi-cured state on all of the wafers 43 stored in the substrate storage 41. Also, the light irradiation module $ILM_2$ does not need the substrate conveyer 42 as provided in the light irradiation module ILM, and thus, is advantageous in terms of manufacturing costs.

Figure 7:
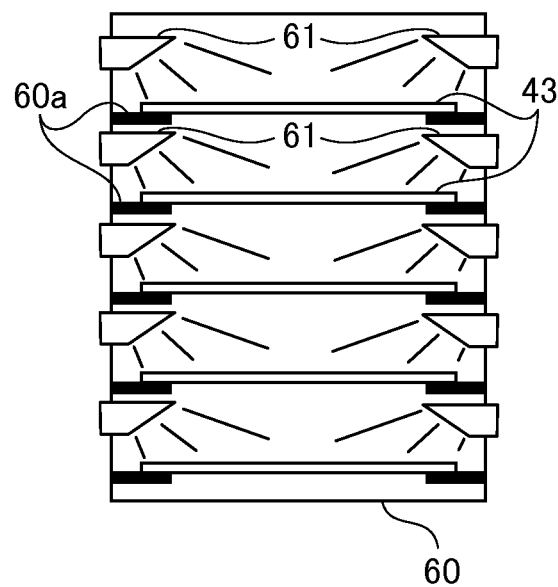
FIG. 7 is a diagram illustrating another configuration of a light irradiation module according to the third embodiment.

FIG. 7 is a diagram illustrating the configuration of the light irradiation module $ILM_3$ as a second example by changing the configuration of the light irradiation module ILM shown in FIG. 5. A feature of the light irradiation module $ILM_3$ lies in the fact that a light irradiation device 61 is provided to each of wafer holding units 60a in a substrate storage 60. In this case, for the light irradiation device 61, a light emitting diode (LED) or the like may be employed. The light irradiation device 61 enables irradiation of ultraviolet light to the wafer 43 held by the wafer holding unit 60a. Note that the number of the light irradiation devices 61 is not necessarily be the same as the number of the wafer holding units 60a installed, but only one irradiation device may irradiate a plurality of wafers 43 with ultraviolet light. In such case, a suitable optical system may further be added. The light irradiation module $ILM_3$ does not need a lightguide optical system such as a light source, an optical fiber, or the like as included in the light irradiation module $ILM_2$ shown in FIG. 6, and thus, is advantageous in terms of implementation.

While, in the above embodiments, a description has been given based on the assumption that the imprint apparatus employs a photo-curing method, the present invention is not limited thereto, but the imprint apparatus may employ other methods such as a thermal cycle method or the like. For example, when a thermal cycle method is employed, a thermosetting resin or a thermoplastic resin is used instead of a photocurable resin. In this case, as a first cure device and a second cure device, a heating device for heating a resin or a cooling device for cooling a resin is used instead of a light irradiation device for emitting ultraviolet light. It is preferable in terms of throughput that the amount of processing area by the second cure device per unit time, that is, the amount of processing area (including the number of shots) such as a heating area or a cooling area, be wider than the amount of processing area by the first cure device. It is also preferable in terms of throughput that the heating capability or the cooling capability of the second cure device be higher than the heating capability or the cooling capability of the first cure device.

Article Manufacturing Method

A method for manufacturing a device (semiconductor integrated circuit element, liquid display element, or the like) as an article may include a step of forming a pattern on a substrate (wafer, glass plate, film-like substrate, or the like) using an imprint apparatus configuring the lithography system described above. Further, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-023984 filed Feb. 7, 2011 which is hereby incorporated by reference herein in its entirety.

What is claimed is:

1. An imprint apparatus that includes a holding unit, and performs an imprint process, including molding of an imprint material on a substrate held by the holding unit using a mold, curing of the molded imprint material, and releasing of the cured imprint material from the mold, to form a pattern on the substrate, the apparatus comprising:
   a first cure device configured to perform a first cure process for the imprint material molded by the mold prior to the releasing; and
   a second cure device configured to perform a second cure process for the imprint material on the substrate conveyed out from the holding unit after the releasing.

2. The imprint apparatus according to claim 1, wherein the first cure device is configured to cure the imprint material such that a hardness H of the imprint material satisfies an inequality of Hr≤H<Hs, and the second cure device is configured to cure the imprint material such that the hardness H of the imprint material becomes Hs, where Hr is a predetermined hardness with which a form of the molded imprint material is kept after the releasing, and Hs is a hardness of the imprint material greater than Hr.

3. The imprint apparatus according to claim 1, wherein the second cure device is configured to perform the second cure process in parallel with conveyance of the substrate.

4. The imprint apparatus according to claim 1, wherein the second cure device is configured to perform, in parallel with the imprint process for one substrate including the first cure process, the second cure process for another substrate.

5. The imprint apparatus according to claim 1, further comprising:
a plurality of imprint stations, each of which being configured to perform the imprint process including the first cure process;
a cure station including the second cure device; and
a conveyer configured to perform conveyance of the substrate between one of the plurality of imprint stations and the cure station.

6. The imprint apparatus according to claim 5, wherein the cure station includes a storage configured to store the substrate conveyed by the conveyer.

7. The imprint apparatus according to claim 6, wherein the second cure device is provided with the storage and configured to cure the imprint material on the substrate stored in the storage.

8. The imprint apparatus according to claim 6, wherein the storage includes an emitting portion configured to emit light that cures the imprint material on the substrate stored therein.

9. The imprint apparatus according to claim 1, wherein an area of the imprint material to be processed per unit time by the second cure device is greater than an area of the imprint material to be processed per unit time by the first cure device.

10. A method of manufacturing an article, the method comprising:
forming a pattern on a substrate using an imprint apparatus that includes a holding unit, and performs an imprint process, including molding of an imprint material on a substrate held by the holding unit using a mold, curing of the molded imprint material, and releasing of the cured imprint material from the mold, to form a pattern on the substrate, wherein the imprint apparatus includes a first cure device configured to perform a first cure process for the imprint material molded by the mold prior to the releasing, and a second cure device configured to perform a second cure process for the imprint material on the substrate conveyed out from the holding unit after the releasing; and
processing the substrate on which the pattern has been formed to manufacture the article.

* * * * *